United States Patent [19]

Kang

[11] Patent Number: 5,299,168
[45] Date of Patent: Mar. 29, 1994

[54] CIRCUIT FOR DETECTING REFRESH ADDRESS SIGNALS OF A SEMICONDUCTOR MEMORY DEVICE

[75] Inventor: Kyung-Woo Kang, Suwon, Rep. of Korea

[73] Assignee: Samsung Electronics Co., Ltd., Suwon, Rep. of Korea

[21] Appl. No.: 50,780

[22] Filed: Apr. 22, 1993

[30] Foreign Application Priority Data

Apr. 22, 1992 [KR] Rep. of Korea ............... 6728/1992

[51] Int. Cl.$^5$ .......................................... G11C 7/00
[52] U.S. Cl. ................................. 365/222; 365/201; 365/233.5
[58] Field of Search ............. 365/201, 222, 189.05, 365/233.5

[56] References Cited

U.S. PATENT DOCUMENTS 4,672,583 6/1987 Nakaizumi .................. 365/201 X
4,758,992 7/1988 Taguchi ........................ 365/222
4,807,196 2/1989 Mizukami ..................... 365/222

Primary Examiner—Eugene R. LaRoche
Assistant Examiner—Christopher R. Glembocki
Attorney, Agent, or Firm—Cushman, Darby & Cushman

[57] ABSTRACT

Disclosed is a refresh address test circuit of a semiconductor memory device having a self-refresh function using a plurality of internal refresh address signals, comprising a plurality of the address test paths, each including a first sub-path which receives an initial logic level of one bit of an initial refresh address and a second sub-path of which receives successive corresponding bits of said refresh address, a plurality of comparators, each connected to the first sub-path and the second sub-path, a test output circuit receives the output signals generated from the plurality of comparators to determine whether a complete cycle of refresh addresses have been generated.

12 Claims, 5 Drawing Sheets

CIRCUIT FOR DETECTING REFRESH ADDRESS SIGNALS OF A SEMICONDUCTOR MEMORY DEVICE

FIELD OF THE ART

The present invention relates to a self-refresh address test circuit for a semiconductor memory device.

BACKGROUND OF THE INVENTION

A Dynamic Random Access Memory ("DRAM"), as is known, contains a memory cell array having a plurality of memory cells Each memory cell is coupled to one of a plurality of word lines and one of a plurality of bit lines, arranged in matrix. Peripheral circuits control read and write operations of data into and out from the selected memory cell.

Each memory cell in the DRAM typically comprises a single MOSFET (metal-oxide-semiconductor field effect transistor) and a single capacitor. Data written into a memory cell is stored in the single capacitor of the memory cell. Thus, the logic state of the data is determined by the amount of the charge stored in the single capacitor. However, with such a structure the data stored in the single capacitor degrades over time due to current leakage. A refresh function is therefore provided to restore the original stored charge data level in the memory cell capacitor.

In known DRAMs, the refresh operation is automatically and repeatedly performed during a predetermined period. This operation is called a self-refresh operation, during which addresses for memory cells are sequentially generated in the . DRAM without using the externally generated addresses used to address memory cells during normal operation.

One conventional self-refresh used in a DRAM is described in Japanese Patent Publication No. 61 57079 (issued in 1986), entitled "A Dynamic Semiconductor Memory Device". In the '079 publication a self-refresh operation mode is enabled after a column address strobe ("CAS") occurs, a row address strobe occurs ("RAS"), and a predetermined time elapses. Known as CAS before RAS refresh mode (referred to as "CBR mode" hereinafter) as described it requires an active "low" state $\overline{CAS}$ signal followed by and active "low" state $\overline{RAS}$ signal at the appropriate time. To complete the initiation of the CBR mode, the row address strobe signal $\overline{RAS}$ must retain its activation level of "low" for a predetermined time lapse of, for example, 16 microseconds.

FIG. 1 shows the functional components of a DRAM employing the above described conventional self-refresh scheme and FIG. 2, illustrates the operation timing of the FIG. 1 DRAM the self refresh operation will be further described. A refresh control circuit 22 generates a refresh clock $\Phi RFSH$. A CBR mode informing signal, generated by a control signal generator 20 which receives a row address strobe signal $\overline{RAS}$, a column address strobe signal $\overline{CAS}$ and a write signal $\overline{WE}$ activates the refresh control circuit 22. A refresh address counter 24 generates a plurality of internal refresh addresses each address having a plurality of internal refresh address signals $Q_0-Q_{n-1}$ corresponding to each address bit position in response to the refresh clock $\Phi RFSH$.

Referring to FIG. 2, which illustrates the refresh clock $\Phi RFSH$ and the internal refresh address signals $Q_0-Q_{n-1}$, the refresh clock $\Phi RFSH$ is generated from the refresh control circuit 22 by an oscillator in response to receipt of the CBR mode informing signal. Once the refresh clock $\Phi RFSH$ is applied to the refresh address counter 24, a plurality of internal refresh address signals $Q_0-Q_{n-1}$ are generated from the refresh address counter 24 and applied to a row decoder 12 for the purpose of selecting rows of memory cells in memory cell array 10 in a regular sequence. Each refresh address, composed of internal refresh address signals $Q_0-Q_{n-1}$, is used to address one row of memory cells during a portion of the self-refresh operation.

However, it is impossible for the conventional self-refresh circuit, as shown in FIG. 1, to detect whether all the internal refresh addresses necessary to accomplish the self-refresh operation have been completely generated. It is also impossible to verify the internal self refresh cycle time as a substantial value. This therefore detracts from the reliability of the resulting DRAM.

SUMMARY OF THE INVENTION

Accordingly, it is an object of the present invention to provide a refresh address test circuit for a semiconductor memory device that is capable of verifying a self-refresh cycle time.

It is still another object of the present invention to provide a semiconductor memory device capable of determining whether all internal refresh addresses corresponding to a complete self-refresh cycle are completely generated.

In order to achieve the objects of the present invention described above, the semiconductor memory circuit according to the present invention includes a refresh address test circuit for detecting whether all of the refresh addresses have been generated. The refresh address test circuit comprises a plurality of address test paths corresponding to each refresh address bit position. Each test path includes a first sub-path for storing an initial level of a single address bit of the refresh address, a second sub-path for receiving subsequent address levels of the same bit position, as well as a plurality of comparators, each connected to one the first sub-path and one associated second sub-path, to detect differences between the initial state refresh address bit and subsequent states of that refresh address bit. A test output circuit for receiving the output signals generated from the plurality of comparators is used to indicate when the initial state refresh address is again reached, thus indicating one refresh cycle has been completed.

It is preferred that each first sub-path includes a latch for holding the initial state refresh address and a switch means for subsequently isolating the initial state of the refresh address from successively generated refresh addresses. It is also preferred that the comparators are activated before the initial state refresh address has each refresh address signal at the same logic level.

These objects and other objects, features, aspects and advantages of the present invention will become more apparent from the following detailed description of the present invention when taken in conjunction with the accompanying drawings.

BRIEF DESCRIPTION OF THE ATTACHED DRAWINGS

DETAILED DESCRIPTION OF A PREFERRED EMBODIMENT

Figure 1:
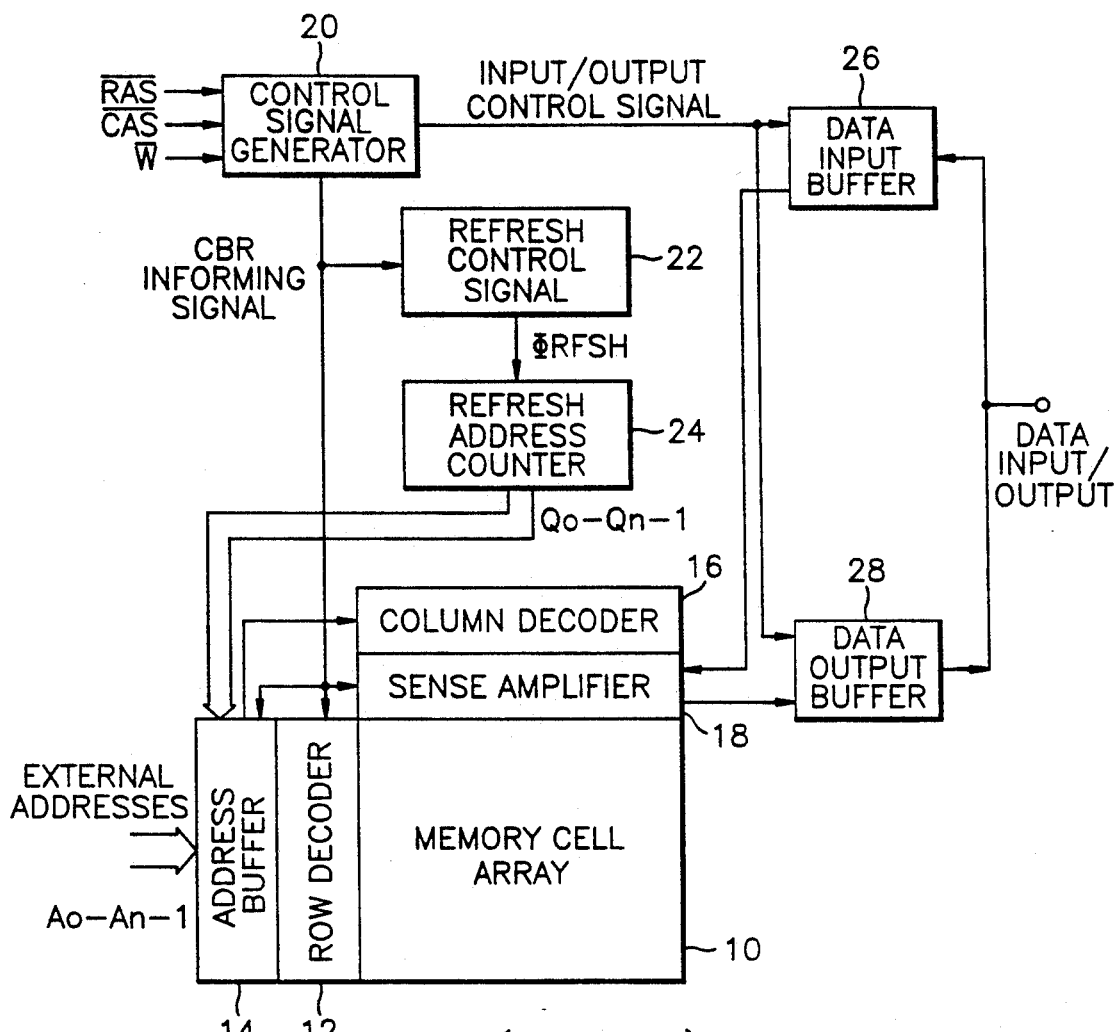
FIG. 1 is a functional block diagram of a conventional semiconductor memory device employing a self-refresh function.
Figure 3:
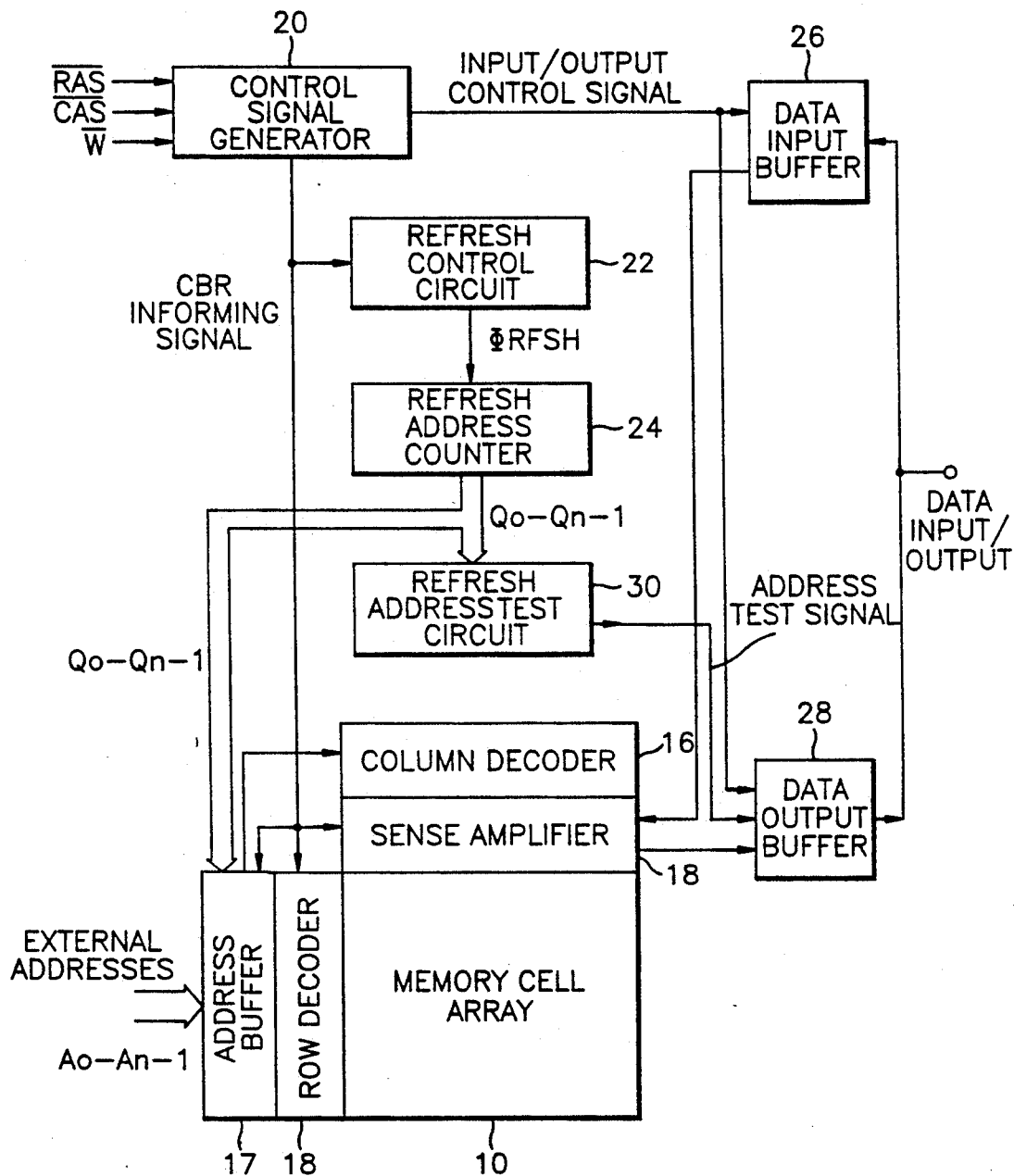
FIG. 3 is a functional block diagram of a semiconductor memory device comprising a refresh address test circuit 5 according to the present invention.

Referring to FIG. 3, functional block elements that are the same as those of FIG. 1 are marked with similar numerals. The difference between the two circuits is that refresh address signals $Q_0-Q_{n-1}$ generated from refresh address counter 24 are applied to a refresh address test circuit 30, which generates an address test signal that is applied to data output buffer 28.

The CBR informing signal generated from control signal generator 20 is applied to refresh control circuit 22, address buffer 14, row decoder 12 and sense amplifier 18. Thus, the address buffer 14 inputs the internal refresh address rather than the external address $A_0-A_{n-1}$ when the semiconductor memory device is in a self-refresh operation mode. The data output buffer 28 outputs the address test signal in response to the input/output control signal generated from control signal generator 20.

Figure 4:
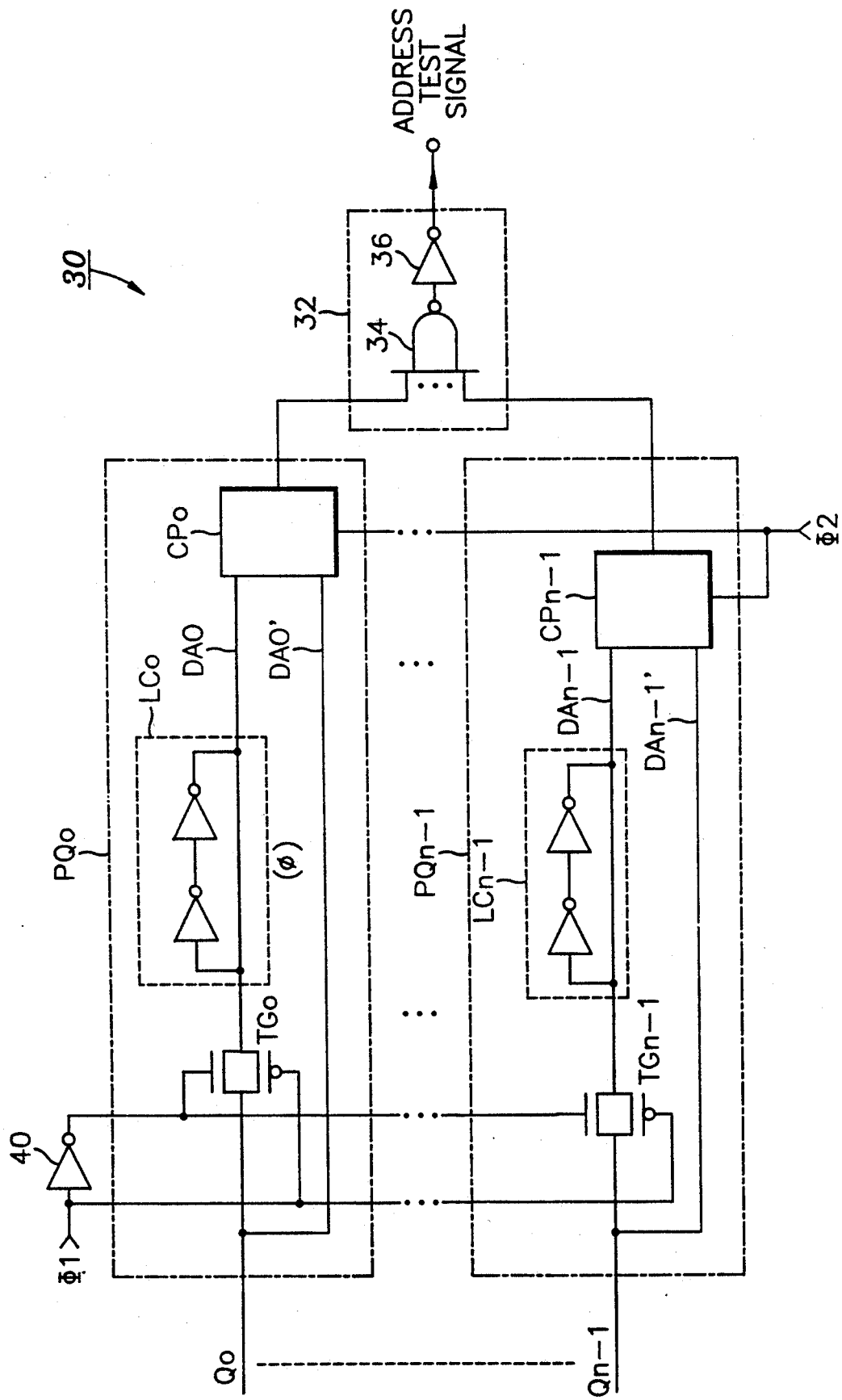
FIG. 4 shows an embodiment of the refresh address test circuit of FIG. 3, according to the present invention.

Referring to FIG. 4, the refresh address test circuit 30 according to the present invention comprises a plurality of address test paths $PQ_0-PQ_{n-1}$ receiving the plurality of the internal refresh address signals $Q_0-Q_{n-1}$ applied from the refresh address counter 24 and a test output circuit 32 receiving all signals passed through the address test paths $PQ_0-PQ_{n-1}$ and generating the address test signal, which detects whether all the refresh addresses for one self-refresh cycle have been completely generated.

The plurality of the address test paths $PQ_0-PQ_{n-1}$ are constructed in the same manner. Representatively, a first address test path $PQ_0$ consists of a first sub-path $DA_0$, a second sub-path $DA_0$, and a first comparator $CP_0$. First comparator $CP_0$ receives respective signals on the first and second sub-paths $DA_0$ and $DA_0$, and its output is controlled by a comparing control signal $\Phi 2$. The first sub-path $DA_0$ receives a first "initial" refresh address signal $Q_0$ and is coupled to one input terminal of the first comparator $CP_0$. A first transmission gate $TG_0$ transfers the first refresh address signal $Q_0$ and is controlled by a transmission control clock $\Phi 1$. A first latch circuit $LC_0$ is coupled between the first transmission gate $TG_0$ and the one input terminal of the first comparator $CP_0$. The second sub-path $DA_0$, directly applies the first and successive refresh address signals $Q_0$ to the other input terminal of the first comparator $CP_0$. Each of the other address test paths $PQ_1$ to $PQ_{n-1}$ is constructed as the first address test path $PQ_0$.

The test output circuit 32 is made of a NAND gate 34 that receives all output signals generated from the plurality of the comparators $CP_0, CP_1, \ldots, CP_{n-1}$ and an inverter 36, coupled to an output terminal of the NAND gate 34, which inverts the output signal of the NAND gate 36 to form the address test signal.

Figure 5:
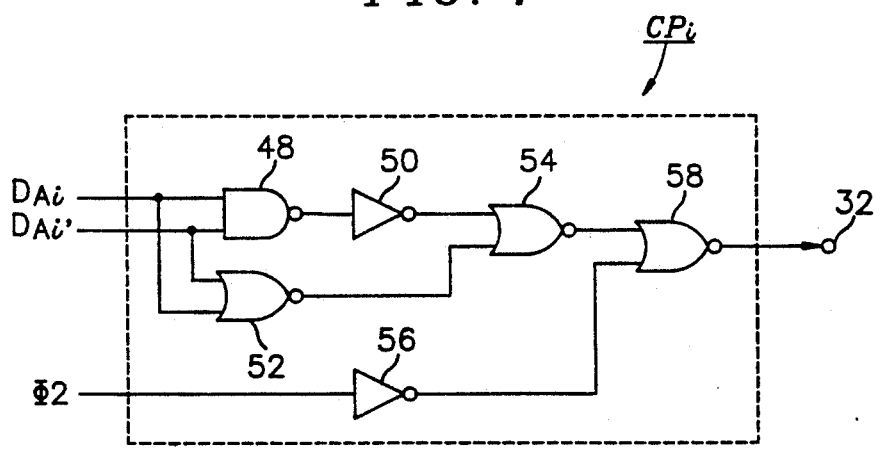
FIG. 5 shows an embodiment of a comparator provided to the refresh address test circuit of FIG. 4, according to the present invention.
Figure 2:
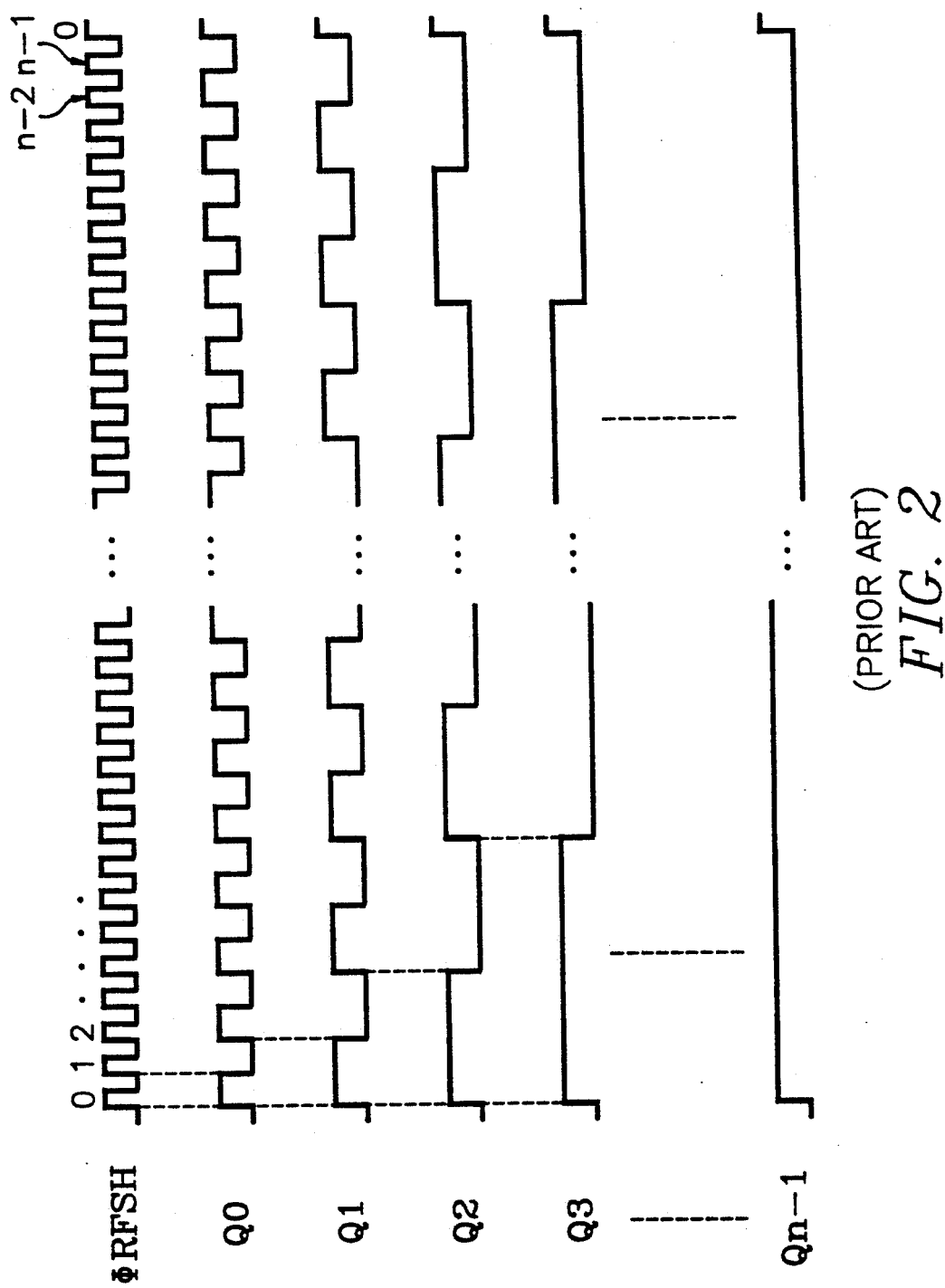
FIG. 2 is a timing chart diagram of FIG. 1, showing a refresh clock and internal refresh address signals.

A logic circuit for each for each of the comparators $CP_0-CP_{n-1}$ is disclosed in FIG. 5. Each comparator CPi consists of a NAND gate 48 and a first NOR gate 52 whose input terminals are commonly coupled to the first and second sub-paths DAi and DAi', an inverter 50 inverting an output signal of the NAND gate 48, a second NOR gate 54 receiving output signals from the inverter 50 and the first NOR gate 52, an inverter 56 inverting the comparing control clock $\Phi 2$, and a third NOR gate 58 receiving the output signals from the second NOR gate 54 and the inverter 56 to apply a compared output signal to the test output circuit 32.

Figure 6:
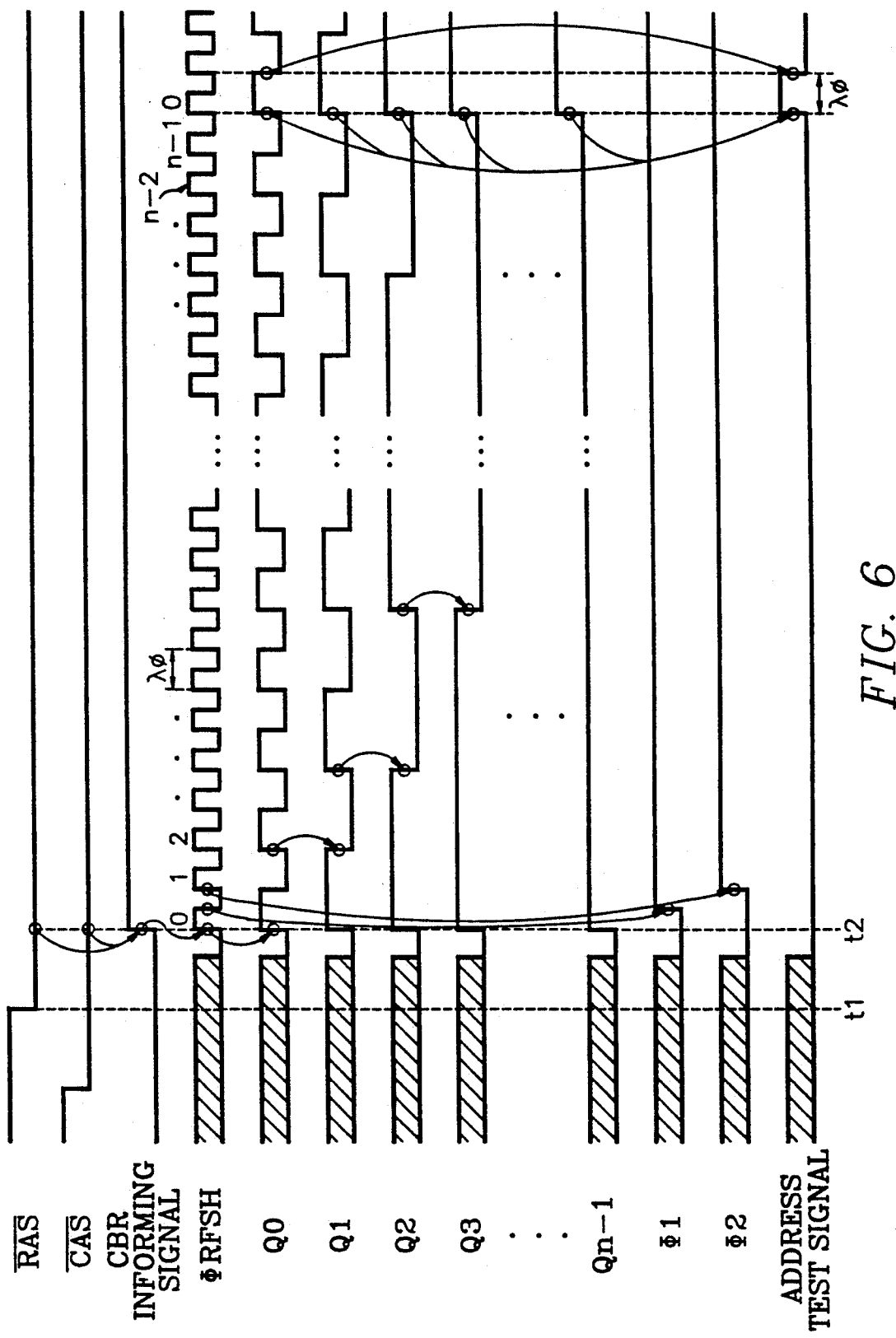
FIG. 6 is a timing chart diagram of FIG. 3, when the semiconductor memory device according to the present invention is performing a self-refresh operation with the refresh address test circuit of FIG. 4.

The operation of the refresh address test circuit according to the present invention will now be described in detail with reference to FIGS. 3 through 6. FIG. 6 illustrates timing of the row address strobe signal $\overline{RAS}$, the column address strobe signal $\overline{CAS}$, the CBR informing signal, the refresh clock $\Phi RFSH$, the control clocks $\Phi 1$ and $\Phi 2$, and the plurality of the internal refresh address signals $Q_0-Q_{n-1}$. When the column address strobe signal $\overline{CAS}$ falls to its active cycle "low" level, the row address strobe signal $\overline{RAS}$ then turns to its active cycle "low" level at a time t1 and a predetermined time period occurs, the CBR informing signal is then generated from the control signal generator 20 of FIG. 3 at a time t2 to initiate a self-refresh operation mode. The CBR informing signal activates refresh control circuit 22, which generates the refresh clock $\Phi RFSH$, as shown in FIG. 6, using an oscillator. The refresh address counter 24 successively generates a plurality of the refresh address signals $Q_0-Q_{n-1}$. The first plurality of refresh address signals $Q_0-Q_{n-1}$ correspond to the highest address value and the last plurality of refresh address signals $Q_0-Q_{n-1}$ correspond to the lowest address value in the embodiment described herein. Refresh address counter 24, in the embodiment being described, thus operates as a down counter.

Initially, control clock $\Phi 1$ retains a "low" level so that transmission gates $TG_0-TG_{n-1}$ are conducting and the initial state internal refresh address signals $Q_0-Q_{n-1}$ are stored into the latch circuits $LC_0-LC_{n-1}$ on the first sub-paths $DA_0-DA_{n-1}$. When a first pulse of the refresh clock $\Phi RFSH$ changes from "high" level to "low" level in first self-refresh cycle, the transmission control clock $\Phi 1$ also changes to a "high" level. The transmission gates $TG_0-TG_{n-1}$ are therefore disabled so that the stored initial state of refresh address signals $Q_0-Q_{n-1}$ are held on the first sub-paths $DA_0-DA_{n-1}$ by the latch circuits $LC_0-LC_{n-1}$ until the self-refresh operation mode has been completed. Subsequently, when the second pulse of the refresh clock $\Phi RFSH$ gates to "high" level. The counter 24 is toggled such that the next plurality of refresh address signals $Q_0-Q_{n-1}$ is generated. Because the state of the one bit position will have changed, the comparing control clock $\Phi 2$ can be changed to a "high" level, thus activating the output of comparators $CP_0-P_{n-1}$, each of which have two input terminals: the one connected to the output of the latch circuit storing the initial state of one of the refresh address signals and the other directly receiving one of each successively toggled plurality of refresh address signals. None of the comparators $CP_0-CP_{n-1}$ will all be at the same "level" (such as all at the "high" level in the embodiment described) until the end of one complete self refresh cycle.

Referring to FIG. 5, in the comparators CPi (any one of the $CP_0-CP_{n-1}$), one input terminal of the NAND gate 48 and the first NOR gate 52 are coupled to the initial logic level of the refresh address signal from the first sub-path DAi (any one of the $DA_0$–$DA_{n-1}$), and the other input terminal of the NAND gate 48 and the first NOR gate 52 are coupled to one of the subsequently toggled plurality of refresh address signals on the second sub-path DAi, (any one of the $DA_0'$–$DA_{n-1}'$).

Because one of the second plurality of refresh address signals Qi (any one of the $Q_0$–$Q_{n-1}$) is on "low" level and the initial state of the refresh address signals Qi (any one of the $Q_0$–$Q_{n-1}$) stored in the latch circuit LCi (any one of the $LC_0$–$LC_{n-1}$) was a "high" level, the second NOR gate 54 receives an output signal of "low" level from the inverter 50 which inerts the output level of the NAND gate 48 and also receives an output signal of "low" level from the first NOR gate 52. Since the comparing control clock $\Phi 2$ assumes the "high" level to activate the output of this comparator CPi (any one of the $CP0$–$CP_{n-1}$), the third NOR gate 58 can generate an output signal of a "low" level and apply it to one of the input terminals of the test output circuit 32 in FIG. 4. Because of this "low" level output signal of the third NOR gate 58 of the comparator CPi, not all of the comparator $CP0$–$CP_{n-1}$ output the "high" level. Thus, the test output circuit 32 outputs a "low" level signal representing that all the plurality of refresh addresses, corresponding to each row of memory cells, have not been generated.

Each subsequent plurality of refresh address signals will result in at least one of the comparators $CP_i$ being in a different state than the other comparators $CP_i$, depending on the present count output from counter 24, until the complete plurality of refresh addresses has been generated. At this time, all of the comparators $CP_0$-$CP_{n-1}$ will be in the same state and each of the comparators $CP_i$ will output a "high" level signal at the output of NOR gate 58. Thus, all of the inputs to NAND gate 34 of test output circuit 32 will be at a "high" level. The NAND gate output will thus change, which after passing through inverter 36, becomes the address test signal indicating one complete cycle of self-refresh operation has been completed. The address test signal is then output through the data output buffer 28, and the self-refresh cycle time can also be verified.

In the embodiment described above, the comparing control clock $\Phi 2$ is activated at the time of that the second pulse of the refresh clock $\Phi$RFSH goes to its "high" level. However, it is possible that the activaton time of the comparing control clock $\Phi 2$ can be designed to be enabled just on or before all the initial state refresh address signals is at a "low" level. This would reduce power consumption as the latches would each "store" a "low" level signal rather than a "high" level signal.

Moreover, the complete plurality of refresh address signals, corresponding to row lines, applied to the comparators, need not necessarily be applied to the comparators $CP_i$ but could be variable.

As stated above, since the present invention provides a refresh test circuit with means for detecting whether a complete cycle of internal refresh address signals have been generated, an accurate self-refresh cycle time can be obtained and any discrepancy between the actual self-refresh cycle time and a "standard" self-refresh cycle time can be eliminated.

While the invention has been described in connection with what is presently considered to be the most practical and preferred embodiments, it is understood that the invention is not limited to the disclosed embodiment, but, on the contrary, is intended to cover various modifications and equivalent arrangements included within the spirit and scope of the appended claims.

What is claimed is:

1. A semiconductor memory device having a self-refresh function, comprising:
   a memory cell array including a plurality of memory cells;
   selection means for selecting certain of said memory cells;
   a refresh control circuit for generating a refresh clock;
   a refresh address counter for successively generating a predetermined plurality of refresh addresses in response to said refresh clock;
   means for applying said successive refresh addresses to said selection means; and
   a refresh address test circuit which receives said successive refresh addresses to detect whether said predetermining plurality of refresh addresses has been generated.

2. A semiconductor memory device according to claim 1, wherein said refresh address test circuit comprises;
   a plurality of comparators, each comparator receiving an initial state refresh address bit and successive state refresh address bits and outputting a successive plurality of
   a test output circuit for receiving said successive plurality of output signals from said comparators, said test output circuit including an AND gate which ANDs together each plurality of output signals.

3. A semiconductor memory device according to claim 2, wherein said refresh address test circuit comprises:
   a plurality of latch means for holding said initial state address bits of said refresh address; and
   a plurality of switch means for transferring each of said initial state refresh address bits of said refresh address to an associated one of said comparators.

4. A semiconductor memory device according to claim 3, wherein each of said switch means is activated before each of said initial state refresh address bits is at a same logic level.

5. A semiconductor memory device according to claim 4 wherein said same logic level corresponds to a substantially zero voltage level.

6. A semiconductor memory device according to claim 3 wherein a $\Phi 1$ clock signal activates each of said plurality of switch means.

7. A semiconductor memory device according to claim 2 wherein each of said plurality of comparators is activated upon receipt of a $\Phi 2$ clock signal, said $\Phi 2$ clock signal being activated after a change from said initial state address is detected.

8. A semiconductor memory device according to claim 1 wherein said memory array is arranged in a plurality of rows and a plurality of columns, said selection means selects successive ones of said plurality of rows, and each said successive refresh addresses corresponds to one of said plurality of rows.

9. A semiconductor memory device according to claim 1 wherein said refresh address test circuit generates an address test signal indicating that said plurality of successive addresses has been detected and further including means for outputting said address test signal.

10. A refresh address test circuit of a semiconductor memory having a self-refresh function that uses a plurality of successively generated internal refresh addresses comprising:

a plurality of address test paths, each test path including a first sub-path for storing an initial state refresh address bit and a second sub-path for transferring successive state refresh address bits of said refresh addresses;

a plurality of comparators, each receiving said initial state refresh address bit from said first sub-path and successive state refresh address bits from said second sub-path and outputting a successive plurality of output signals; and a test output circuit for receiving the successive plurality output signals generated from said plurality of comparators to determine whether said predetermined plurality of refresh addresses has been generated.

11. A semiconductor memory device according to claim 10, wherein said refresh address test circuit comprises:

a plurality of latch means for holding said initial state address bits of said refresh address; and a plurality of switch means for transferring each of said initial state refresh address bits of said refresh address to an associated one of said comparators.

12. A semiconductor memory device according to claim 10, wherein each of said comparators is activated before each of said refresh address bits is at a same logic level.

* * * * *